(12) United States Patent
Lin et al.

(10) Patent No.: US 8,455,888 B2
(45) Date of Patent: Jun. 4, 2013

(54) LIGHT EMITTING DIODE MODULE, AND LIGHT EMITTING DIODE LAMP

(75) Inventors: Ming-Te Lin, Taipei County (TW);
Ming-Yao Lin, Taipei County (TW);
Shang-Pin Ying, Hsinchu (TW);
Chih-Hsuan Liu, Hsinchu County (TW); Kuang-Yu Tai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 238 days.

(21) Appl. No.: 12/978,646

(22) Filed: Dec. 27, 2010

(65) Prior Publication Data

US 2011/0284878 A1 Nov. 24, 2011

Related U.S. Application Data

(60) Provisional application No. 61/346,703, filed on May 20, 2010.

(51) Int. Cl.
*H01L 33/48* (2010.01)

(52) U.S. Cl.
USPC .......... 257/88; 257/72; 257/98; 257/E33.073; 257/E33.056

(58) Field of Classification Search
USPC ................. 257/72, 88, 98, E33.073, E33.056
See application file for complete search history.

(56) References Cited

U.S. PATENT DOCUMENTS

| 2005/0073244 | A1 | 4/2005 | Chou et al. | |
| 2007/0145397 | A1* | 6/2007 | DenBaars et al. | 257/98 |
| 2008/0283856 | A1 | 11/2008 | Weng | |
| 2009/0162667 | A1 | 6/2009 | Radkov | |
| 2009/0284969 | A1* | 11/2009 | Chang | 362/241 |
| 2010/0027270 | A1* | 2/2010 | Huang et al. | 362/310 |
| 2010/0134017 | A1 | 6/2010 | Yatsuda et al. | |
| 2011/0215696 | A1* | 9/2011 | Tong et al. | 313/46 |

FOREIGN PATENT DOCUMENTS

| CN | 1902764 | 1/2007 |
| CN | 101079464 | 11/2007 |
| CN | 101138102 | 3/2008 |

OTHER PUBLICATIONS

"Office Action of China Counterpart Application", issued on Sep. 5, 2012, p. 1-p. 7.

* cited by examiner

*Primary Examiner* — Victor A Mandala
*Assistant Examiner* — Whitney T Moore
(74) *Attorney, Agent, or Firm* — Jianq Chyun IP Office

(57) ABSTRACT

A light emitting diode (LED) lamp including a socket, an LED module disposed on the socket, and a lamp housing assembled to the socket is provided. LED module includes a supporting member and a plurality of LED packages, wherein each LED package includes a chip carrier, a reflective member, an LED chip, a lens, and a phosphor layer. Reflective member mounted on the chip carrier has a recess for exposing parts of the chip carrier. LED chip disposed in the recess. Lens encapsulating the LED chip has a light-emitting surface, a first reflection surface bonded with the reflective member and a second reflection surface, wherein the LED chip faces the light-emitting surface of the lens.

25 Claims, 14 Drawing Sheets

LIGHT EMITTING DIODE MODULE, AND LIGHT EMITTING DIODE LAMP

CROSS-REFERENCE TO RELATED APPLICATION

This application claims the priority benefit of U.S. provisional application Ser. No. 61/346,703, filed on May 20, 2010, all disclosures are incorporated therewith.

TECHNICAL FIELD

The present application relates to a light emitting diode (LED) module, and an LED lamp.

BACKGROUND

Due to the advantages of long lifetime, small size, low heat emission, and low power consumption, LEDs have been widely applied in various home appliances and instruments as indicators or light sources. With recent development towards multicolor and high illumination, the applications of the LEDs are extended to large-sized outdoor billboards, traffic lights, etc. In the future, the LEDs may become the power-saving and environment-protecting light sources in replacement of tungsten filament lamps and mercury vapor lamps. LED chips are mainly made of compounds of groups III-V, for example, gallium phosphide (GaP), gallium arsenide (GaAs) or other semiconductor compounds. In order to enhance optical performance and reliability of LEDs, various package technologies for encapsulating LED chips are proposed.

SUMMARY

According to an embodiment, an LED module comprises a supporting member and a plurality of LED packages assembled with the supporting member. Each LED package comprises a chip carrier, a reflective member, an LED chip, a lens, and a phosphor layer. The Reflective member is mounted on the chip carrier and has a recess for exposing parts of the chip carrier. The LED chip disposed in the recess. The lens encapsulates the LED chip. The lens has a light-emitting surface, a first reflection surface connected with the reflective member and a second reflection surface, wherein the LED chip facing the light-emitting surface of the lens. The phosphor layer is disposed on the light-emitting surface of the lens.

According to another embodiment, an LED lamp comprises a socket, an LED module disposed on the socket, and a lamp housing assembled to the socket and encapsulating the LED module. The LED module comprises a supporting member and a plurality of LED packages assembled with the supporting member. Each LED package comprises a chip carrier, a reflective member, an LED chip, a lens, and a phosphor layer. The Reflective member is mounted on the chip carrier and has a recess for exposing parts of the chip carrier. The LED chip disposed in the recess. The lens encapsulates the LED chip. The lens has a light-emitting surface, a first reflection surface connected with the reflective member and a second reflection surface, wherein the LED chip facing the light-emitting surface of the lens. The phosphor layer is disposed on the light-emitting surface of the lens.

BRIEF DESCRIPTION OF THE DRAWINGS

FIG. 4b schematically illustrates the blue light leakage in FIG. 4a.

FIG. 5b schematically illustrates the blue light leakage in FIG. 5a.

FIG. 7b is a top view of the LED module in FIG. 7a.

FIG. 8b is a top view of the LED module in FIG. 8a.

FIG. 9b is an exploded-view of the LED lamp in FIG. 9a.

FIG. 9c is a partial cross-sectional view of the LED lamp in FIG. 9a.

DETAILED DESCRIPTION

Figure 1:
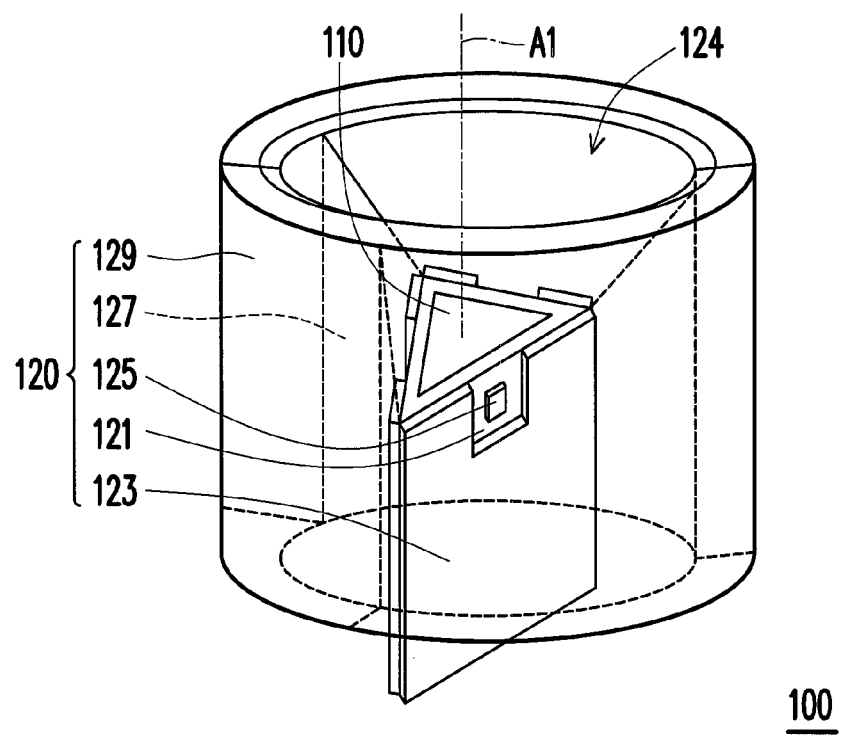
FIG. 1 is a perspective view schematically illustrating an LED module according to an embodiment of the present application.
Figure 2:
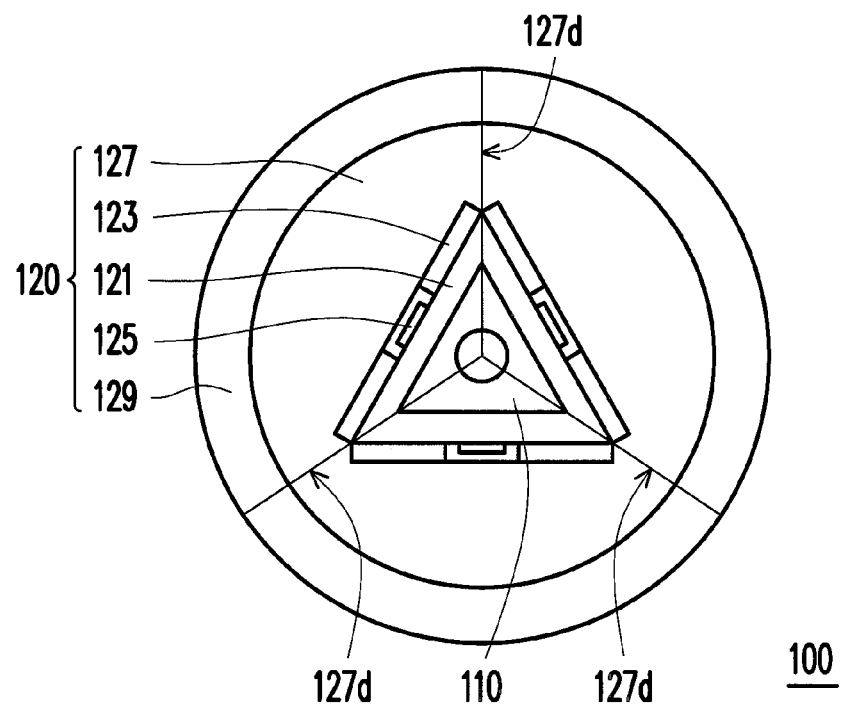
FIG. 2 is a top view of the LED module in FIG. 1.
Figure 3:
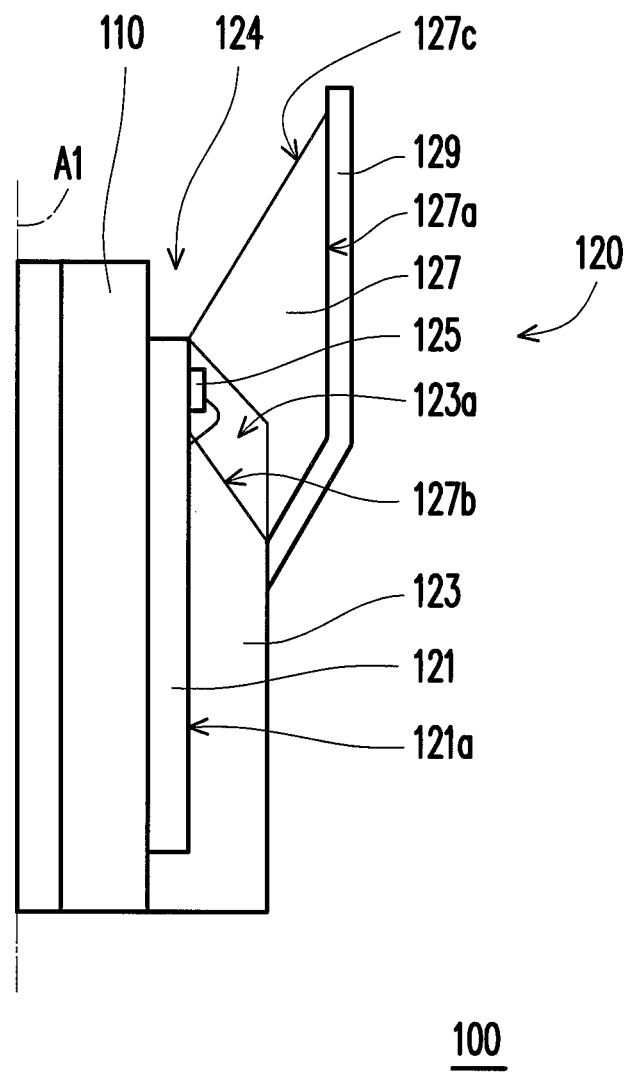
FIG. 3 is a cross-sectional view of the LED module in FIG. 2.

FIG. 1 is a perspective view schematically illustrating an LED module according to an embodiment of the present application. FIG. 2 is a top view of the LED module in FIG. 1. FIG. 3 is a cross-sectional view of the LED module in FIG. 2. Referring to FIG. 1 through FIG. 3, the LED module 100 of the present embodiment comprises a supporting member 110 and a plurality of LED packages 120 assembled with the supporting member 110. Each of the LED packages 120 comprises a chip carrier 121, a reflective member 123, an LED chip 125, a lens 127, and a phosphor layer 129. In the present embodiment, the chip carrier 121 is a lead frame, for example, such that the LED chip 125 is capable of being mounted thereon. The reflective member 123 is mounted on the chip carrier 121 and has a recess 123a for exposing parts of the chip carrier 121. In other words, a chip accommodating space is defined over the chip carrier 121 by the recess 123a of the reflective member 123. The LED chip 125 is disposed in the recess 123a and is electrically connected to the chip carrier 121, and the LED chip 125 is suitable for emitting a light when a driving current is applied to the LED chip 125 through the chip carrier 121. A lens 127 is bonded with the reflective member 123 and the chip carrier 121 and is disposed in the recess 123a of the reflective member 123 so as to encapsulate the LED chip 125. The lens 127 has a light-emitting surface 127a, a first reflection surface 127b bonded with the reflective member 123 and a second reflection surface 127c, wherein the LED chip 125 faces the light-emitting surface 127a of the lens 127. Moreover, the phosphor layer 129 is disposed on the light-emitting surface 127a of the lens 127.

When the LED chip 125 in each of the LED packages 120 receives the driving current transmitted by the chip carrier 121, the LED chip 125 emits a light with predetermined wavelength. Then, the light emitted from the LED chip 125 propagates toward the light-emitting surface 127a of the lens 127 so as to excite the phosphor layer 129 on the light-emitting surface 127a. For example, the light emitted from the LED chip 125 is a blue light. After the phosphor layer 129 is irradiated and excited by the light emitted from the LED chip 125, a secondary light (e.g. yellow light) with a wavelength which is different from that of the light emitted from the LED chip 125 is generated. The light emitted from the LED chip 125 and the secondary light generated by the phosphor layer 129 are mixed and a white light is obtained. In the present embodiment, wavelength of the light emitted from the LED chip 125 and wavelength of the secondary light generated by the phosphor layer 129 are not strictly limited in the present embodiment. In order to facilitate excitation of the phosphor layer 129 and generate the secondary light successfully, wavelength of the light emitted from the LED chip 125 should be less than that of the secondary light.

Referring to FIG. 3, the LED chip 125 of the present embodiment is mounted on a supporting surface 121a of the chip carrier 121 through a paste (e.g. silver paste or other thermal conductive pastes and/or electrically conductive pastes), and the first reflection surface 127b and the second reflection surface 127c extend laterally from the supporting surface 121a of the chip carrier 121 toward the light-emitting surface 127a respectively, wherein the first and the second reflection surfaces 127b and 127c are opposite to each other. In other words, the LED chip 125 is encircled by the first reflection surface 127b and the second reflection surface 127c. Moreover, the first reflection surface 127b and the second reflection surface 127c are total reflection surfaces for reflecting parts of the light emitted from the LED chip 125. Accordingly, the light propagating toward the first reflection surface 127b is substantially reflected back to the light-emitting surface 127a of the lens 127, and the light propagating toward the second reflection surface 127c is reflected back to the light-emitting surface 127a of the lens 127. In this way, the amount of the light emitted from the LED chip 125 and propagating toward the light-emitting surface 127a increases so as to enhance the light-emitting efficiency of the LED module 100.

Figure 4A:
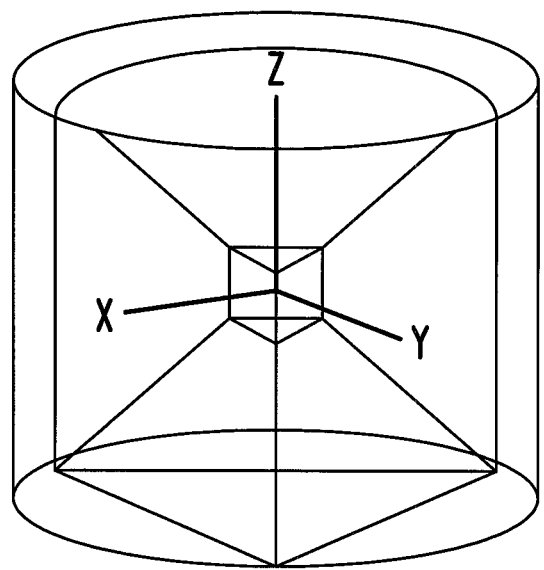
FIG. 4a schematically illustrates the LED module in FIG. 1.
Figure 4B:
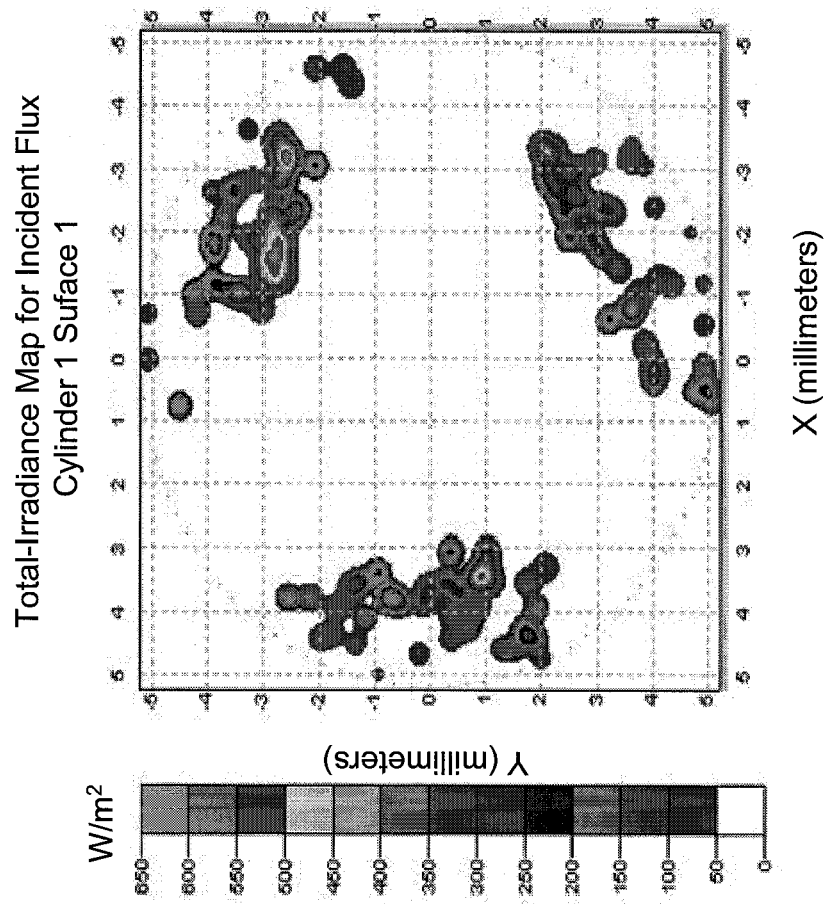
Figure 5A:
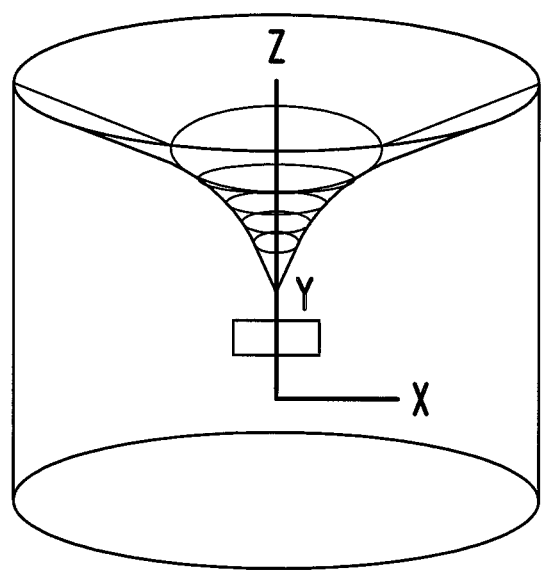
FIG. 5a schematically illustrates a conventional LED module.
Figure 5B:
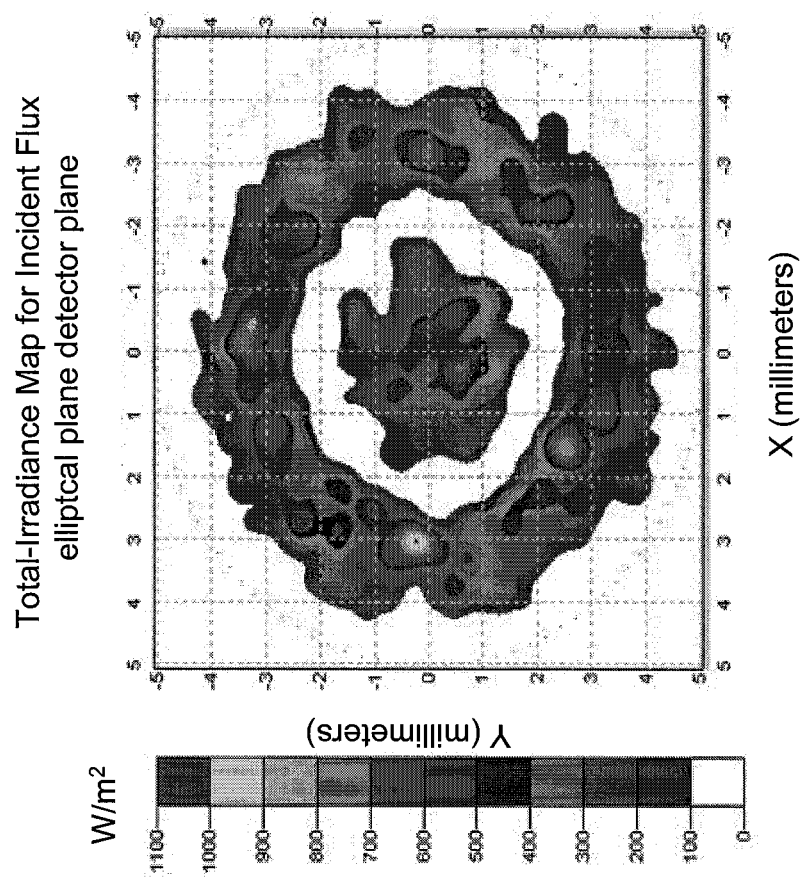

FIG. 4a schematically illustrates the LED module in FIG. 1. FIG. 4b schematically illustrates the blue light leakage in FIG. 4a. FIG. 5a schematically illustrates a conventional LED module. FIG. 5b schematically illustrates the blue light leakage in FIG. 5a. Referring to FIGS. 4a, 4b, 5a, and 5b, the percentage of the blue light leakage occurred at the top side of the LED module 100 is about 0.2%, and the percentage of the blue light leakage at the top side of the conventional LED module is about 1.5%. Compared with the conventional LED module, blue light leakage occurred in the LED module 100 of the present embodiment can be neglected. In other words, the LED module 100 of the present embodiment can reduce the blue light leakage effectively.

Figure 6A:
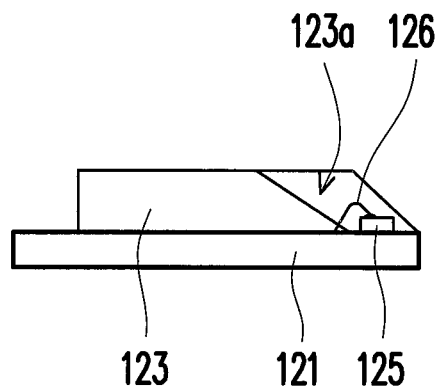
FIGS. 6a through 6f depict the fabricating process of the LED package.
Figure 6B:
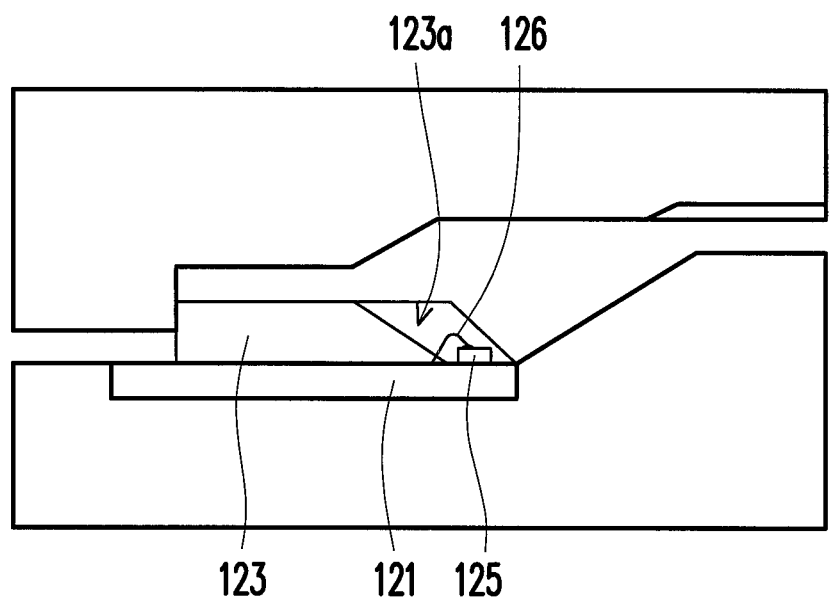
Figure 6C:
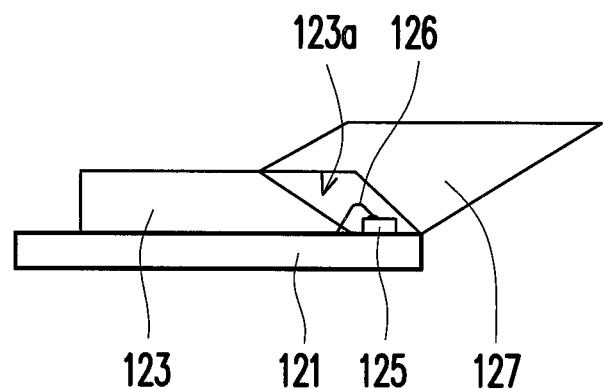
Figure 6D:
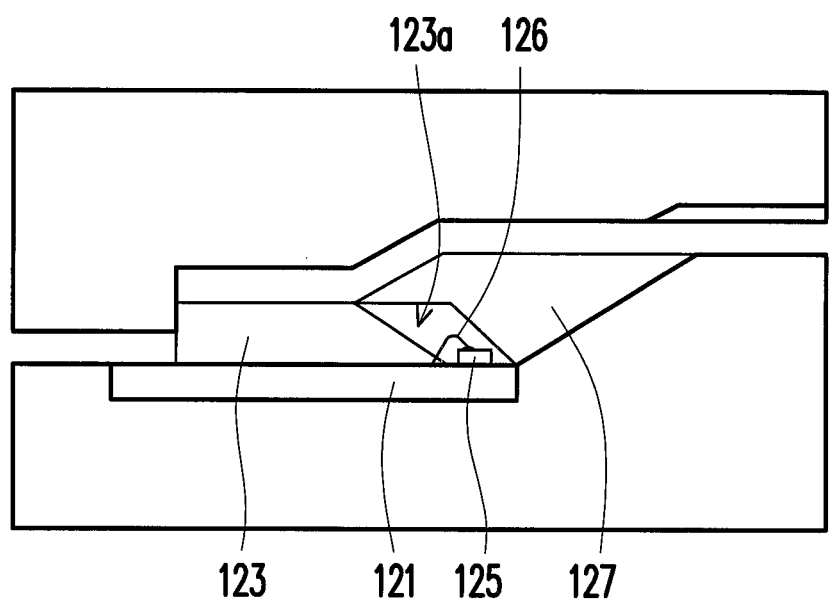
Figure 6E:
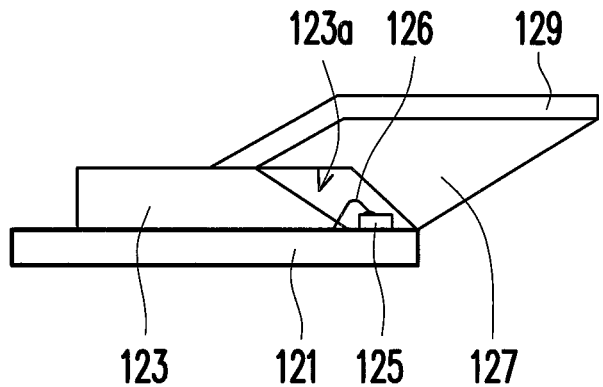
Figure 6F:
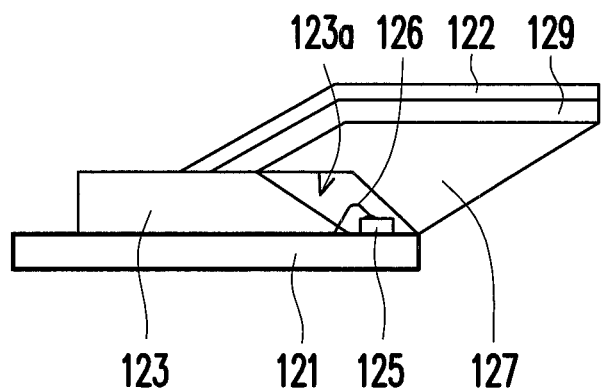

FIGS. 6a through 6f depict the fabricating process of the LED package. Referring to FIG. 6a, the LED chip 125 is mounted on the chip carrier 121 and is electrically connected to the chip carrier 121 through at least one bonding wire 126. Thereafter, the reflective member 123 having the recess 123a is formed on the chip carrier 121 by a mold-injection process. Referring to FIGS. 6b and 6c, the lens 127 is formed by a mold-injection process. Specifically, the lens 127 directly covers the chip carrier 121 and the reflective member 123 and encapsulates the LED chip 125. After that, referring to FIGS. 6d through 6e, the phosphor layer 129 is formed on the lens 127 by a mold-injection process. Referring to FIG. 6f, after the phosphor layer 129 is formed, the protection layer 122 is optionally formed over the phosphor layer 129 to prevent the phosphor layer 129 from peeling-off or being scratched.

Referring to FIGS. 1~3, in the present embodiment, the LED packages 120 are assembled on the supporting member 110 and are arranged in a circle. In detail, the lenses 127 of the LED packages 120 together constitute a pillar architecture. An indentation 124 is formed on the top of the pillar architecture after the lenses 127 of the LED packages 120 are assembled on the supporting member 110. The depth of the indentation 124 gradually decreases along a direction from the supporting member 110 to the light-emitting surface 127a. Besides, each of the lenses 127 has a pair of adhesion surfaces 127d, and the adhesion surfaces 127d of different lenses 127 are connected to each other that the lenses 127 are assembled to each other and integrally formed into the pillar architecture. Moreover, an intersection of an orthogonal plane of the extending axis A1 and each of the light-emitting surfaces 127a is an arc which is ⅓ of the circle, but the amounts of the lenses 127 of the LED packages 120 are not limited in the present embodiment. In other embodiments, an intersection of an orthogonal plane of the extending axis and each of the light-emitting surfaces is an arc which is 1/n of the circle and n is the quantities of the lenses. In this way, the LED module 100 can emit light toward a plurality of directions through the light-emitting surfaces 127a.

Figure 7A:
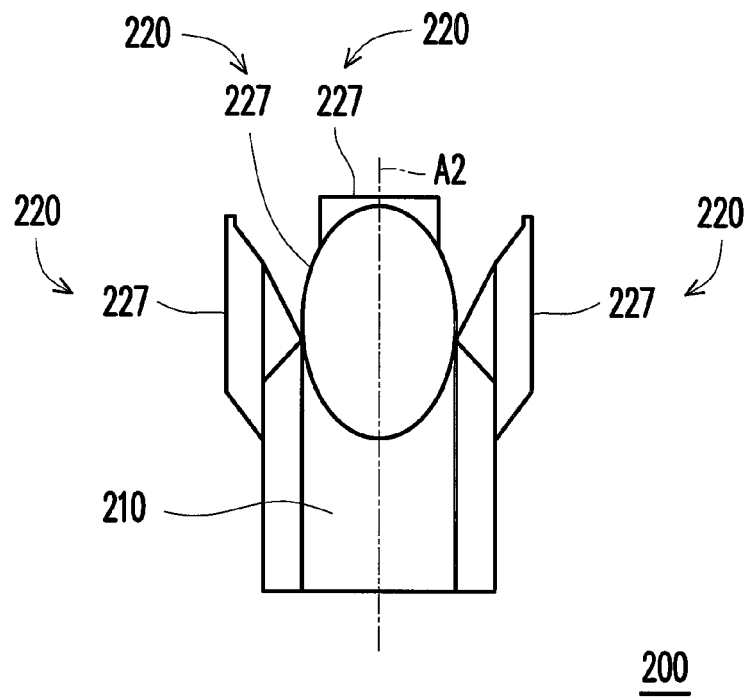
FIG. 7a schematically illustrates an LED module according to another embodiment of the present application.
Figure 7B:
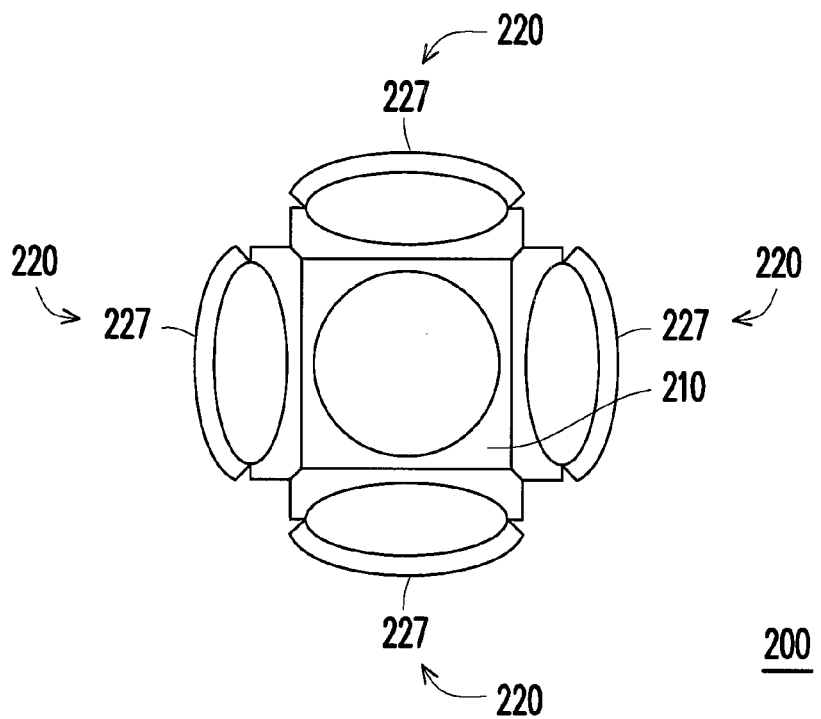

Besides, the shape and the arrangement of the lens are not limited by the present embodiment. FIG. 7a schematically illustrates an LED module according to another embodiment of the present application. FIG. 7b is a top view of the LED module in FIG. 7a. Referring to FIGS. 7a and 7b, the LED module 200 is similar with the LED module 100 except that the LED module 200 in the present embodiment includes four LED packages 220 assembled with the supporting member 210. The lenses 227 of the LED packages 220 together constitute a pillar architecture, but an intersection of the orthogonal plane of an extending axis A2 of the pillar architecture and each of the light-emitting surfaces is a section of a circle. In other words, the lenses 227 of the packages 220 are physically separated when assembling with the supporting member 210.

Figure 8A:
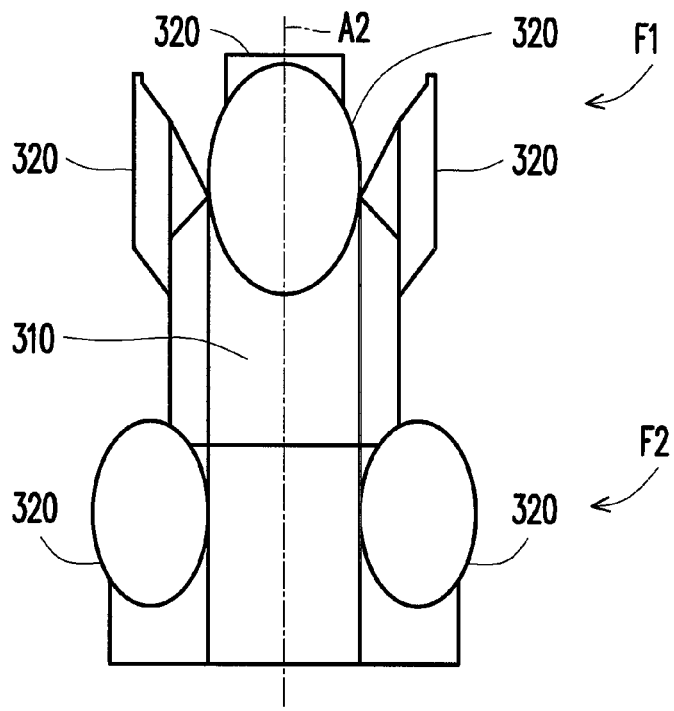
FIG. 8a is side view of an LED module according to yet another embodiment of the present application.
Figure 8B:
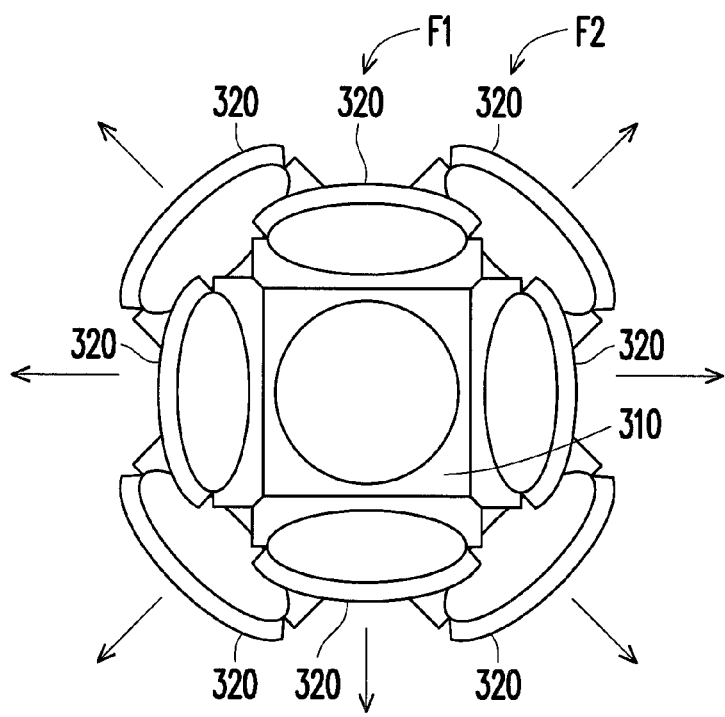

FIG. 8a is side view of an LED module according to yet another embodiment of the present application. FIG. 8b is a top view of the LED module in FIG. 8a. Referring to FIGS. 8a and 8b, the LED packages 320 in the embodiment are classified into a first group of the LED packages F1 and a second group of the LED packages F2. These two groups of the LED packages F1, F2 are in different levels along the extending axis A2, respectively. In other words, the first group F1 is located above the second group F2. Specifically, the propagating direction of the light emitted from each of the light-emitting surfaces 127a of the first group of the LED packages F1 is different from the propagation direction of the light emitted from each of the light-emitting surfaces 227a of the second group of the LED packages F2. In this way, the LED module including the first group of the LED packages F1 and the second group of the LED packages F2 provide favorable uniformity of illumination.

Besides, the arrangement of the LED packages 320 of the first group of the LED packages F1 are more concentrated than the arrangement of the LED packages 320 of the second group of the LED packages F2. However, the arrangement of the LED packages 320 of the first group of the LED packages F1 and that of the LED packages 320 of the second group of the LED packages F2 are not limited in the present embodiment. The arrangement of the LED packages 320 can be properly modified in accordance with the design requirements.

Figure 9A:
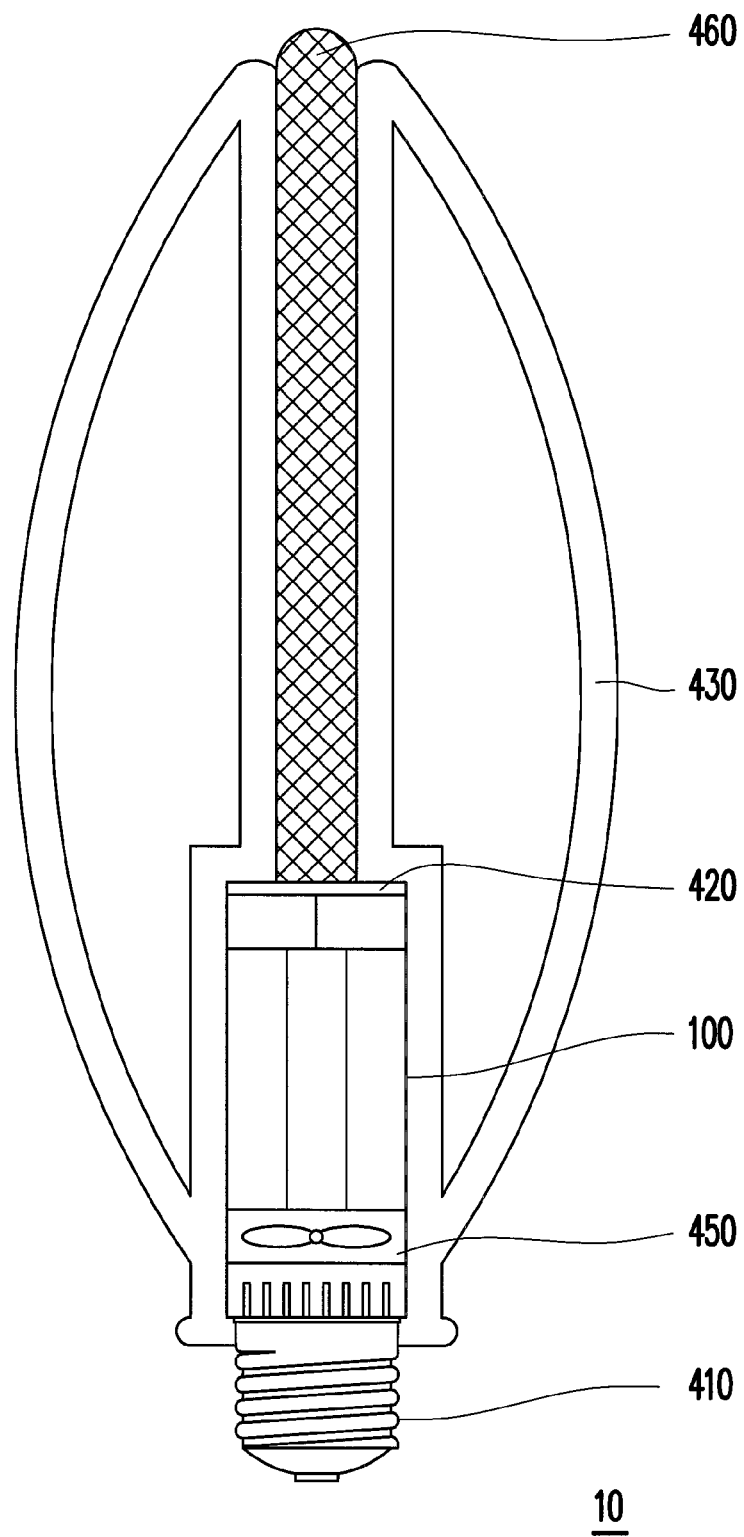
FIG. 9a is a side view of an LED lamp according to an embodiment of the present application.
Figure 9B:
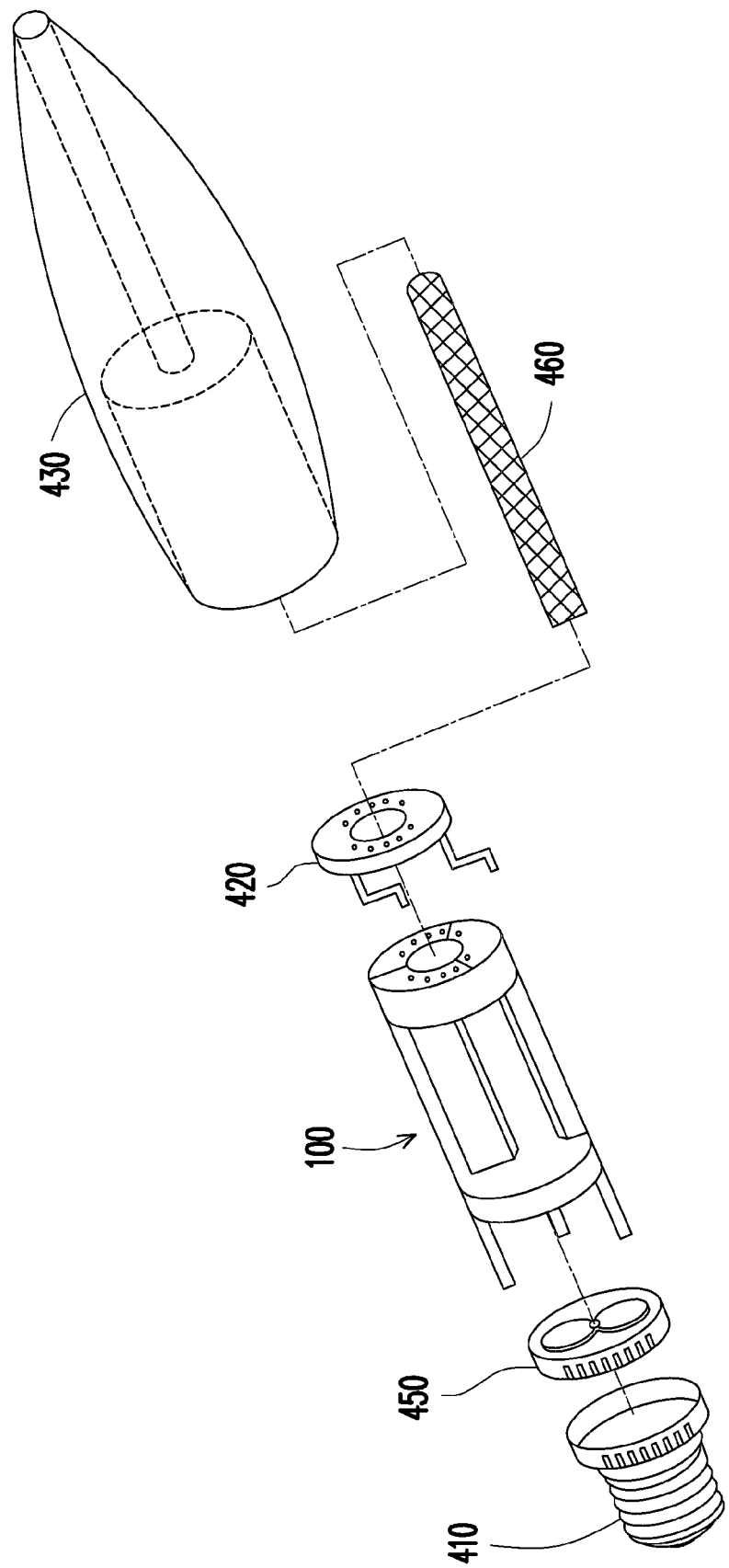
Figure 9C:
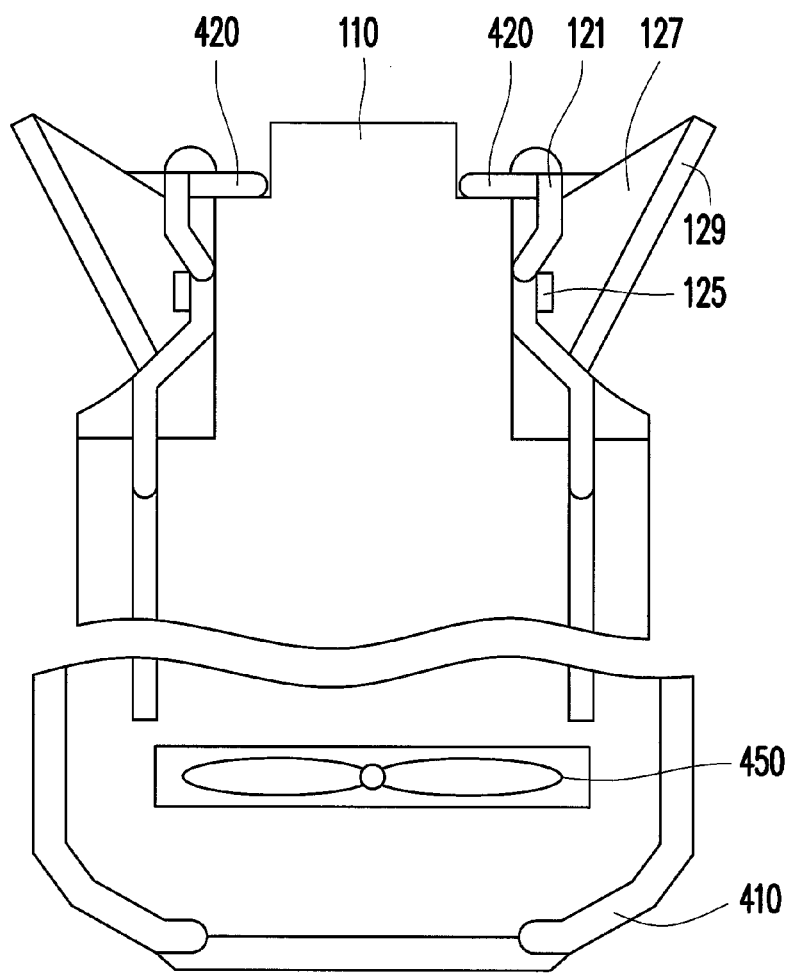
Figure 9D:
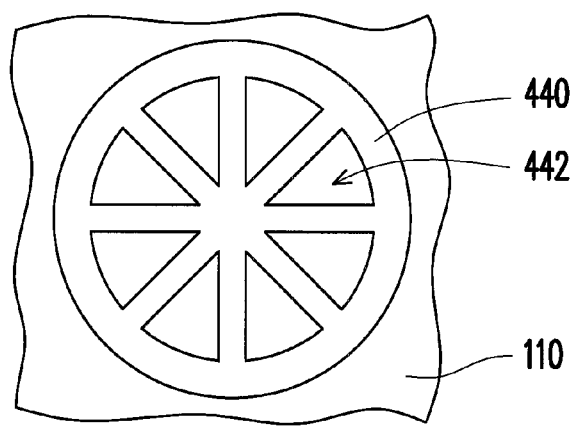
FIG. 9d is a partial cross-sectional view of the supporting member in FIG. 9c.

FIG. 9a is a side view of an LED lamp according to an embodiment of the present application. FIG. 9b is an exploded-view of the LED lamp in FIG. 9a. FIG. 9c is a partial cross-sectional view of the LED lamp in FIG. 9a. FIG. 9d is a partial cross-sectional view of the supporting member in FIG. 9c. Referring to FIGS. 9a through 9d, The LED lamp 10 of the present embodiment includes a socket 410, an LED module 100, a circuit board 420, and a lamp housing 430. Because the LED module 100 in the LED lamp 10 has been described above, a relevant description thereof is omitted. The socket 410 is selected from the type of E10 socket, E11 socket, E12 socket, E14 socket, E17 socket, E27 socket, E39 socket, and E40 socket, etc. The detail specifications of the E10, E11, E12, E14t, E17, E27, E39, and E40 sockets are well-known to one ordinary skilled in the art and the relevant description thereof is omitted accordingly. The LED module 100 is disposed on the socket 410. The circuit board 420 is assembled to the LED module 100 and electrically connected to the chip carrier 121 and the socket 410. The lamp housing 430 is assembled to the socket 410 and encapsulating the LED module 100. Besides, the LED lamp 10 further comprises a heat sink 440 integrated in the supporting member 110, a fan 450 assembled to the heat sink 440, and a filtration member 460 disposed on the inner wall of the lamp housing 430. The heat sink 440 can be a structure with a plurality of air flow channels 442 along the extending axis A1 and connected to the chip carrier 121. The filtration member 460 is used for blocking insects or other objects outside of the LED lamp 10. Besides, the fan 450 generates an air flow passing through the air flow channels 442 and the filtration member 460 to dissipate the heat generated from the LED module 100 such that the heat carried by the air flow can be brought to the outside of the lamp housing 430.

In summary, since the LED chip faces the light-emitting surface of the lens and the light propagating toward the first reflection surface and the second reflection surface are reflected back to the light-emitting surface of the lens, the LED module reduces the light leakage phenomenon. Therefore, the LED module, and the LED lamp of the present application have favorable light-emitting efficiency.

It will be apparent to those skilled in the art that various modifications and variations can be made to the structure of the present application without departing from the scope or spirit of the application. In view of the foregoing, it is intended that the present application covers modifications and variations of this application provided they fall within the scope of the following claims and their equivalents.

What is claimed is:

1. A light emitting diode (LED) module, comprising:
   a supporting member;
   a plurality of LED packages, assembled with the supporting member, each of the LED packages comprising:
      a chip carrier, mounted on the supporting member;
      a reflective member, mounted on the chip carrier and having a recess for exposing parts of the chip carrier;
      an LED chip, disposed in the recess;
      a lens, encapsulating the LED chip, the lens having a light-emitting surface, a first total reflection surface connected with the reflective member and a second total reflection surface, the LED chip facing the light-emitting surface of the lens, wherein the lens fills the recess of the reflective member; and
      a phosphor layer, disposed on the light-emitting surface of the lens.

2. The LED module of claim 1, further comprising a heat sink integrated in the supporting member.

3. The LED module of claim 2, further comprising a fan assembled to the heat sink.

4. The LED module of claim 1, wherein the lenses of the LED packages are constituted in a pillar, an intersection of each light-emitting surface and an orthogonal plane of an extending axis of the pillar is an arc, and the arc is 1/n of a circle, where n is the quantity of the lenses.

5. The LED module of claim 4, wherein an intersection of the plurality of light-emitting surfaces and the orthogonal plane of the extending axis is a circle.

6. The LED module of claim 4, wherein the lens has an indentation, a depth of the indentation decreases along the extending axis from the light-emitting surface toward the LED chip.

7. The LED module of claim 4, wherein the LED packages comprising:
   a first group of the LED packages; and
   a second group of the LED packages, wherein the LED chips of the each groups are in two different levels along the extending axis.

8. The LED module of claim 4, wherein the lens has a pair of adhesion surfaces located at opposite sides of the first and the second total reflection surfaces, the adhesion surfaces of different lens are connected to one other.

9. The LED module of claim 1, wherein the LED chip of each of the LED packages is encircled by the first total reflection surface and the second total reflection surface.

10. The LED module of claim 1, wherein a light propagating toward the first total reflection surface is reflected back to the light-emitting surface of the lens, and a light propagating toward the second total reflection surface is reflected back to the light-emitting surface of the lens.

11. The LED module of claim 1, wherein the lenses of the LED packages are connected to one other such that the light-emitting surfaces of the lenses are connected to one other.

12. The LED module of claim 1, wherein the second total reflection surface is not connected with the reflective member.

13. The LED module of claim 1, wherein the first total reflection surface is in contact with the reflective member.

14. A light emitting diode (LED) lamp, comprising:
   a socket;
   an LED module, disposed on the socket, comprising:
      a supporting member;
      a plurality of LED packages, assembled with the supporting member, each of the LED packages comprising:
         a chip carrier, mounted on the supporting member;
         a reflective member, mounted on the chip carrier and having a recess for exposing parts of the chip carrier;
         an LED chip, disposed in the recess;
         a lens, encapsulating the LED chip, the lens having a light-emitting surface, a first total reflection surface connected with the reflective member and a second total reflection surface, the LED chip facing the light-emitting surface of the lens;
         a phosphor layer, disposed on the light-emitting surface of the lens; and
   a lamp housing, encapsulating the LED module, wherein the lenses of the LED packages are connected to one other such that the light-emitting surfaces of the lenses are connected to one other.

15. The LED lamp of claim 14, further comprising a filtration member, disposed on the inner wall of the lamp housing.

16. The LED lamp of claim 14, wherein the lenses of the LED packages are constituted in a pillar, an intersection of each light-emitting surface and an orthogonal plane of an extending axis of the pillar is an arc, and the arc is 1/n of a circle, where n is the quantity of the lens.

17. The LED lamp of claim 16, wherein an intersection of the plurality of light-emitting surfaces and the orthogonal plane of the extending axis is a circle.

18. The LED lamp of claim 16, wherein the lens has an indentation, a depth of the indentation decreases along the extending axis from the light-emitting surface toward the LED chip.

19. The LED lamp of claim 16, wherein the LED packages comprising:
   a plurality groups of the LED packages, wherein the LED chips of the each groups are in different levels along the extending axis.

20. The LED lamp of claim 14, wherein the lens has a pair of adhesion surfaces located at opposite sides of the first and the second total reflection surfaces, the adhesion surfaces of different lens are connected to one other.

21. The LED lamp of claim 14, wherein the LED chip is mounted on a supporting surface of the chip carrier, and the first total reflection surface extends from the supporting surface of the chip carrier toward the light-emitting surface.

22. The LED lamp of claim 14, wherein the LED chip is encircled by the first total reflection surface and the second total reflection surface.

23. The LED lamp of claim 14, wherein a light propagating toward the first total reflection surface is reflected back to the light-emitting surface of the lens, and a light propagating toward the second total reflection surface is reflected back to the light-emitting surface of the lens.

24. The LED lamp of claim 14, wherein the lenses of the LED packages are connected to one other such that the light-emitting surfaces of the lenses are connected to one other.

25. The LED module of claim 14, wherein the first total reflection surface is in contact with the reflective member.

* * * * *